United States Patent [19]

Hill et al.

[11] Patent Number: 6,068,171
[45] Date of Patent: May 30, 2000

[54] WIRE CONVEYANCE SYSTEM HAVING A CONTACTLESS WIRE SLACKING DEVICE

[75] Inventors: William H. Hill, Pala; John B. Gabaldon, San Diego; Todd G. Wieseler, Carlsbad, all of Calif.

[73] Assignee: Palomar Technologies, Inc., Vista, Calif.

[21] Appl. No.: 09/113,665

[22] Filed: Jul. 10, 1998

[51] Int. Cl.[7] .................................................. B65H 20/00
[52] U.S. Cl. ......................... 226/97.1; 226/45; 226/100; 226/118.1; 242/413.6
[58] Field of Search .............................. 226/97.1, 118.1, 226/100, 45; 242/615.12, 413.6

[56] References Cited

U.S. PATENT DOCUMENTS

| | | | |
|---|---|---|---|
| 3,156,398 | 11/1964 | Lauxen et al. | 242/615.12 |
| 3,861,207 | 1/1975 | Barbee | 226/45 X |
| 4,059,241 | 11/1977 | De Roeck et al. | 242/615.12 X |
| 4,500,043 | 2/1985 | Brown | 226/45 X |
| 4,572,421 | 2/1986 | Hug et al. | 228/103 |
| 4,763,826 | 8/1988 | Kulicke, Jr. et al. | 226/45 X |
| 5,224,641 | 7/1993 | Spicer | 242/615.12 |
| 5,310,107 | 5/1994 | Todd et al. | 242/615.12 X |
| 5,318,234 | 6/1994 | Biggs et al. | 242/54 R |
| 5,647,276 | 7/1997 | Tilton, Sr. | 226/45 X |
| 5,775,611 | 7/1998 | Threlkeld | 226/97.1 X |

FOREIGN PATENT DOCUMENTS 893350  4/1962  United Kingdom ............... 226/45

*Primary Examiner*—Donald P. Walsh
*Assistant Examiner*—Minh-Chau Pham
*Attorney, Agent, or Firm*—Rodney F. Brown

[57] ABSTRACT

A wire conveyance system is provided for a wire bonding machine having, in series, a first wire handler, a wire slacking device and a second wire handler. The wire slacking device includes a wire support chamber having a substantially enclosed bottom, opposing first and second vertical sidewalls, a substantially open top, a back opening and a front opening. The wire slacking device further includes a pressurized fluid source and first and second fluid orifices for receiving a pressurized fluid from the pressurized fluid source. The fluid orifices extend through the first or second sidewall of the wire support chamber with the second fluid orifice being positioned downstream of the first fluid orifice. First and second fluid paths are provided in fluid communication with the pressurized fluid source via the first and second fluid orifices. The first and second fluid paths extend upward between the first and second sidewalls of the wire support chamber and out the open top. A wire support path extends laterally through the wire support chamber above the first and second fluid orifices. The wire support path is substantially contactless with respect to the wire slacking device.

22 Claims, 3 Drawing Sheets

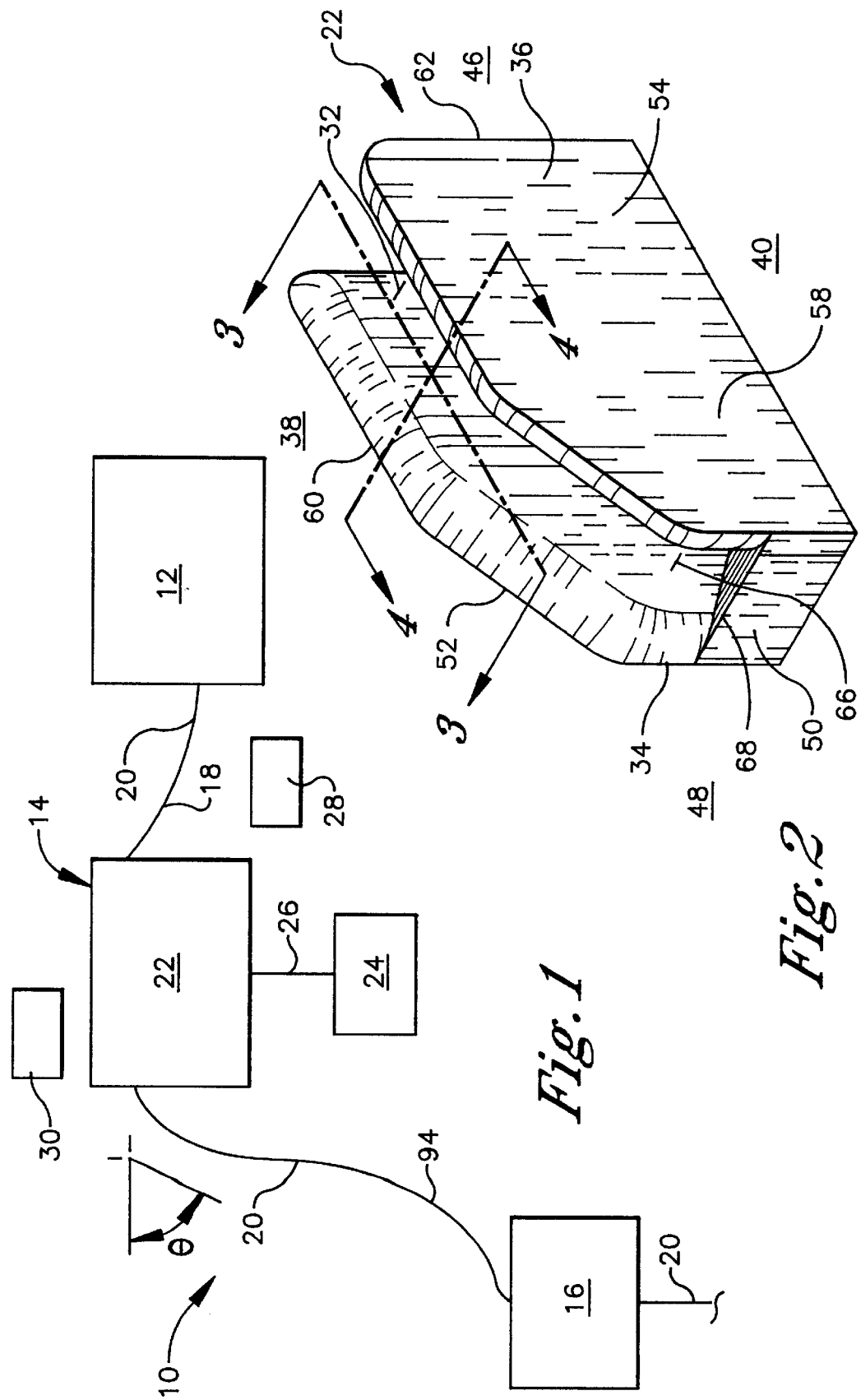

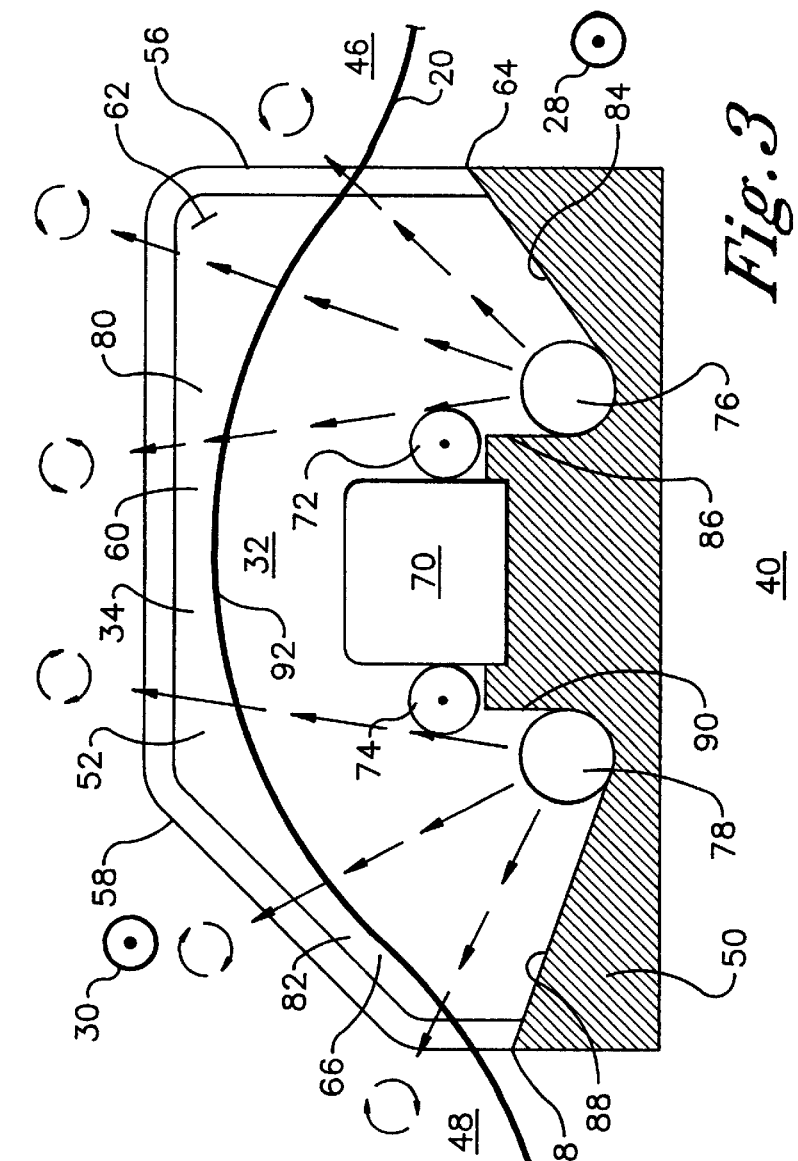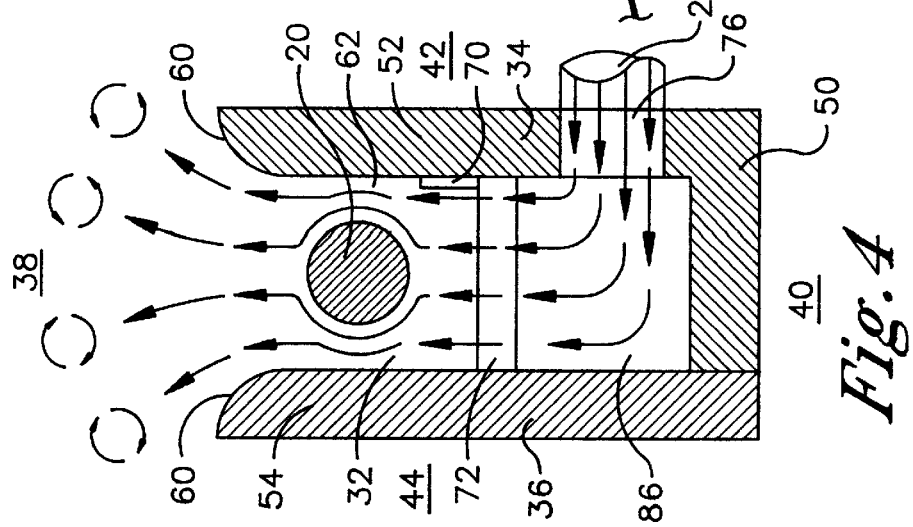

WIRE CONVEYANCE SYSTEM HAVING A CONTACTLESS WIRE SLACKING DEVICE

TECHNICAL FIELD

The present invention relates generally to automated wire bonding, and more particularly to a series of devices which convey a bonding wire through a wire bonding machine.

BACKGROUND OF THE INVENTION

Miniature, electric power drawing elements, such as integrated circuits, semiconductors and the like, included within a larger host device typically have many electrically conductive pads. Each conductive pad requires electrical contact with one or more corresponding conductive pads on the same element or associated elements of the host device to form an electrically conductive connection between the pads. The electrically conductive connection is provided by a segment of fine, electrically conductive wire which extends between the pads and is bonded to a bonding site on each of the pads. Wire bonding is an automated operation performed during assembly of the host device using a machine having a high degree of speed and precision. The wire bonding operation is cyclic, comprising many bonding cycles integrated into a continuous unitary process. Each bonding cycle of the process comprises a number of discrete tasks performed sequentially by specific components of the wire bonding machine.

In a simple case where an electrical connection is required between only two pads, the bonding cycle comprises the tasks of retaining an element or elements including the pad pair, conveying a bonding wire from a wire supply to the pad pair, positioning the wire at the first bonding site on the first pad of the pair, bonding the wire to the first bonding site, repositioning the wire at the second bonding site on the second pad of the pair, bonding the wire to the second bonding site, and breaking off the wire at the second bonding site to provide a wire segment which electrically connects the first and second pads. These tasks are repeated in the next bonding cycle at another pad pair. For more complex bonding cycles where electrical connection is required between a string of three or more pads, the wire is positioned and bonded to the bonding site on each pad of the string in series. The wire is not broken off until the bond is completed at the final bonding site to provide a wire segment which electrically connects every pad of the string.

The task of conveying the bonding wire from the wire supply to the bonding site is critical to the performance of the wire bonding machine because any damage due to contamination, deformation, blemishing, or the like inflicted on the surface of the wire during the conveyance task can diminish the integrity of the ensuing wire bond. Accordingly, considerable effort in the prior art is directed to providing non-damaging means for conveying the bonding wire. For example, U.S. Pat. No. 5,318,234, incorporated herein by reference, discloses a wire de-spooler which conveys the bonding wire from a wire supply spool to a downstream wire handler. The wire de-spooler includes a spool drive motor to pay out the bonding wire from the spool and a wire slacking device comprising an air nozzle, a bail and a guide spindle positioned at the wire de-spooler outlet, which forms and maintains a desired slack length in the bonding wire. In operation, the wire slacking device suspends the bonding wire between a contact point on the spool and a contact point on the guide spindle as the bonding wire is paid out from the spool. The air nozzle and bail are positioned on the wire path between the spool and guide spindle. When the bonding wire passes through the bail, the air nozzle, which is positioned immediately above the bail, directs a downward jet of pressurized air directly onto the bonding wire. The force of the air jet on the bonding wire operates against the static force of the spool and guide spindle to create a slack length in the bonding wire between the spool and guide spindle. Maintenance of the slack length desirably reduces the risk of wire damage as the wire is being de-spooled. Maintenance of the slack length particularly reduces the risk of wire twisting during de-spooling which is extremely detrimental to subsequent wire bonding.

Although the above-described prior art wire slacking device may effectively prevent wire twisting, direct application of the air jet to the bonding wire in turbulent flow as well as contact between the bonding wire and the guide spindle or bail create a significant risk of damage to the bonding wire. The present invention recognizes a need for a wire conveyance system which controls the degree of slack in the bonding wire with a diminished risk of damage to the bonding wire. Therefore, it is an object of the present invention to provide an effective wire conveyance system. More particularly, it is an object of the present invention to provide a wire conveyance system having a device which effectively controls the desired degree of slack in the bonding wire as the bonding wire is conveyed between wire handlers. It is another object of the present invention to provide such a wire slacking device which controls the rate at which the wire is conveyed between wire handlers. It is yet another object of the present invention to provide such a wire slacking device which operates in a non-damaging manner with respect to the bonding wire. It is still another object of the present invention to provide such a wire slacking device which operates in a contactless manner with respect to the bonding wire and wire slacking device. These objects and others are accomplished in accordance with the invention described hereafter.

SUMMARY OF THE INVENTION

The present invention is a wire conveyance system for a wire bonding machine. The wire conveyance system includes, in series, a first wire handler, a wire slacking device and a second wire handler. The wire slacking device comprises a wire support chamber having a substantially enclosed bottom and opposing first and second vertical sidewalls. The wire support chamber also has a substantially open top, a back opening and a front opening. The wire slacking device further comprises a pressurized fluid source retaining a pressurized fluid. First and second fluid orifices in fluid communication with the pressurized fluid source extend through the first or second sidewall of the wire support chamber, with the second fluid orifice being positioned downstream of the first fluid orifice. The central axes of the first and second fluid orifices are each aligned substantially perpendicular to the first and second sidewalls.

First and second fluid paths are provided in fluid communication with the pressurized fluid source via the first and second fluid orifices, respectively. The first fluid path extends continuously through the wire support chamber, passing into the first fluid orifice, upward between the first and second sidewalls, and out the open top of the wire support chamber. The second fluid path follows a substantially similar route as the first fluid path, but passing into the second fluid orifice downstream of the first fluid path. A wire support path is provided in fluid communication with the first and second fluid paths. The wire support path extends continuously through the wire support chamber above the first and second fluid orifices, passing into the back opening, laterally between the first and second sidewalls, and out the front opening of the wire support chamber. The wire support path is substantially contactless with respect to the wire slacking device.

The wire slacking device additionally comprises first and second internal wire sensors positioned in the wire support chamber below the wire support path and a wire sensor positioned above the wire support path. The first internal wire sensor is a proximity sensor positioned between the first and second fluid orifices. The second internal wire sensor is a contact sensor.

The present invention is further a method of maintaining a slack length in a bonding wire utilizing the above-recited wire conveyance system in cooperation with the bonding wire. The method is initiated by feeding the bonding wire from a first wire handler to a wire support chamber at a wire feed rate. The wire is conveyed laterally through the wire support chamber along a wire support path while a pressurized fluid is injected into the wire support chamber at a fluid injection rate and at a substantially perpendicular angle to the first and second sidewalls of the wire support chamber. The pressurized fluid is injected via first and second fluid orifices which are in fluid communication with the wire support chamber and which are positioned below the wire support path. The pressurized fluid is directed upward through the first and second fluid paths past the wire, thereby suspending the wire in the wire support path in substantially contactless relation with the sides of said wire support chamber. The wire is withdrawn from the wire support chamber to a second wire handler at a wire withdrawal rate and a slack length is formed in the wire withdrawn from the wire support chamber as a function of the fluid injection rate, the wire feed rate and the wire withdrawal rate. The method further includes monitoring fluctuations in the position of the wire in the wire support path and varying the wire feed rate from the first wire handler to the wire slacking device in response to the position fluctuations to maintain the slack length substantially constant.

The present invention will be further understood from the drawings and the following detailed description.

BRIEF DESCRIPTION OF THE DRAWINGS

FIG. 1 is a diagrammatic view of a wire conveyance system of the present invention which includes a wire slacking device.

FIG. 2 is a perspective view of the wire slacking device of FIG. 1.

FIG. 3 is a cross-sectional side view of the wire slacking device of FIG. 1.

FIG. 4 is a cross-sectional front view of the wire slacking device of FIG. 1.

DESCRIPTION OF PREFERRED EMBODIMENTS

Figure 5:
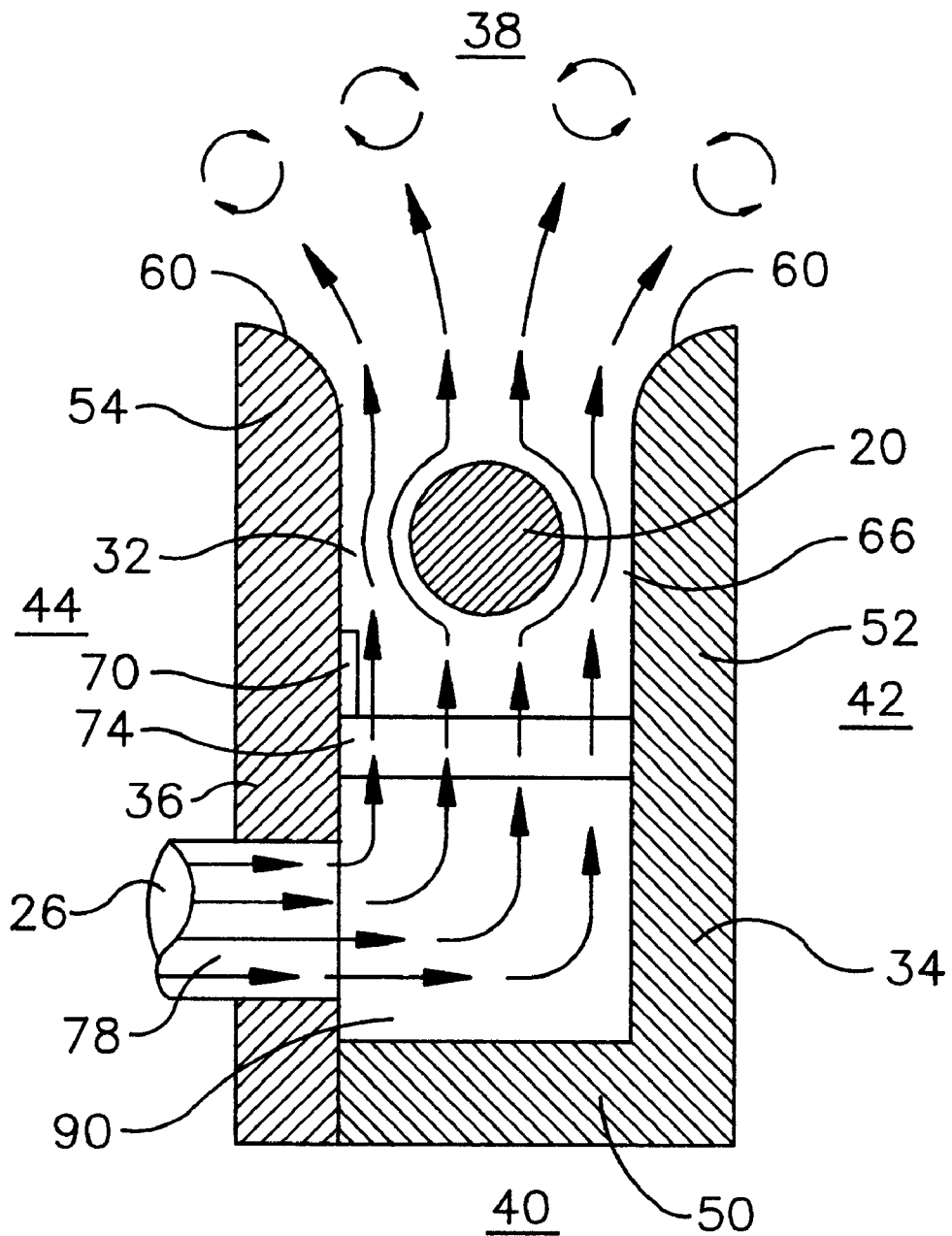
FIG. 5 is a cross-sectional back view of an alternate embodiment of a wire slacking device of the present invention.

Referring initially to FIG. 1, a wire conveyance system of the present invention is shown and generally designated 10. The wire conveyance system 10 comprises, in series, a first wire handler 12, a wire slacking device 14, and a second wire handler 16, which together define a wire conveyance path 18 for a bonding wire 20. The wire slacking device 14 comprises a primary housing 22 and a plurality of associated components including a pressurized fluid source 24, such as a high pressure vessel, and a fluid line 26 extending from the source 24 to the housing 22 which enables fluid communication therebetween. An external upstream sensor 28 is also included external to and upstream of the housing 22 beneath the wire conveyance path 18. An external downstream sensor 30 is included external to and downstream of the housing 22 above the wire conveyance path 18. The external upstream and downstream sensors 28, 30 are preferably each contact sensors which generate an electrical detection signal upon contact with the wire 20. The external upstream sensor 28 and external downstream sensor 30 are in electrical communication with a controller (not shown) of the first wire handler 12, such as a servo system.

For purposes of defining "downstream" and "upstream", the terms are relative to the primary direction of travel of the bonding wire 20, which is deemed to originate at the first wire handler 12 and travel in the direction of the second wire handler 16. The first wire handler 12 is positioned in the wire conveyance path 18 upstream of the wire slacking device 14 and the second wire handler 16 is positioned in the wire conveyance path 18 downstream of the wire slacking device 14. As is appreciated by the skilled artisan, the wire conveyance system 10 is an integral part of a wire bonding machine, the remainder of which is not shown. The first and second wire handlers 12, 16 are substantially any known device which performs an operation on the bonding wire 20 as it is conveyed through the system 10. Thus, for example, the first wire handler 12 can be a wire supply spool and spool drive motor, such as disclosed in U.S. Pat. No. 5,318,234, and the second wire handler can be a wire tensioning device located upstream of a bond head which is positioned at the termination of the wire conveyance path 18, such as disclosed in commonly assigned U.S. patent applications Ser. No. 09/113,722, entitled "Bond Head Having Dual Axes of Motion" and Ser. No. 09/113,666, entitled "Wire Tensioning Device for a Wire Bonding Machine", both filed concurrently with the present application and incorporated herein by reference.

The first wire handler 12 is positioned on substantially the same horizontal plane as the housing 22 of the wire slacking device 14, while the second wire handler 16 is positioned below the housing 22 of the wire slacking device 14 at an angle θ approaching 90° from the horizontal plane. Although the wire conveyance system 10 disclosed herein is not limited to the present configuration, the system 10 is typically configured such that the wire slacking device 14 redirects the wire conveyance path 18 at an acute angle or right angle from the horizontal plane of the first wire handler 12 as the wire conveyance path 18 proceeds from the wire slacking device 14 to the second wire handler 16.

Referring additionally to FIGS. 2–4, the wire slacking device 14 of the system 10 is shown to comprise a wire support chamber 32 defined by the housing 22. The housing 22 is a rigid two-piece construction consisting of a body 34 and a cover 36. The wire support chamber 32 has three pairs of opposing sides, a top and a bottom 38, 40, a first lateral side and a second lateral side 42, 44, and a back and a front 46, 48. The top 38 is substantially open to the external environment while the bottom 40 is substantially enclosed by a base 50 of the body 34 which is joined to the lower edge of the cover 36. The first and second lateral sides 42, 44 are likewise substantially enclosed. The first lateral side 42 is enclosed by a first vertical sidewall 52 of the body 34, which is integrally constructed with the base 50, preferably from a durable metal or plastic. The second lateral side 44 is enclosed by a second vertical sidewall 54 forming the cover 36, which is preferably fabricated from a transparent material such as a high-strength, clear, static-dissipating plastic enabling visual access to the wire support chamber 32.

The first and second sidewalls 52, 54 have substantially matching profiles with the back border 56 of both sidewalls 52, 54 being substantially square at the top and bottom, and the front border 58 of both sidewalls 52, 54 being square at the bottom, but cut away at an angle as the top is approached. The back border 56, front border 58 and top border 60 of both sidewalls 52, 54 are beveled to form a continuous chamfer on each sidewall 52, 54. The first and second sidewalls 52, 54 extend vertically in opposing parallel relation to each other and are spaced a fixed horizontal distance apart, which corresponds to the width dimension of the wire support chamber 32. The preferred width dimension of the wire support chamber 32 is in a range of about 3 to 15 mil, whereas the bonding wire typically has a diameter in a range of about 0.5 to 10 mil. The first and second sidewalls 52, 54 also preferably have a length dimension which is substantially greater than their height dimension such that the wire support chamber 32 correspondingly has a substantially greater length dimension than height dimension. The preferred length dimension of the wire support chamber 32 is in a range of about 3 to 6 inches and the preferred height dimension is in a range of about 2 to 4 inches.

The back 46 of the wire support chamber 32 is provided with a back opening 62 which is continuous on its upper end with the open top 38 and is bounded by a back edge 64 on its lower end. The front 48 of the wire support chamber 32 is correspondingly provided with a front opening 66 which is continuous on its upper end with the open top 38 and is bounded by a front edge 68 on its lower end.

An internal central sensor 70 is mounted in the first sidewall 52 within the interior of the wire support chamber 32. The internal central sensor 70 is positioned beneath the wire conveyance path 18 proximal to the base 50 and approximately midway between the back 46 and front 48 of the wire support chamber 32. The internal central sensor 70 is preferably a proximity sensor which continuously monitors the proximity of the wire 20 to the sensor 70. A pair of internal upstream and downstream sensors 72, 74 are also mounted within the interior of the wire support chamber 32. The internal upstream and downstream sensors 72, 74 are each positioned beneath the wire conveyance path 18 upstream and downstream of the internal central sensor 70, respectively. The internal upstream and downstream sensors 72, 74 are positioned at the same height within the wire support chamber 32, which is preferably at about the same height or somewhat below the height of the internal central sensor 70. The internal upstream and downstream sensors 72, 74 are preferably each contact sensors which generate an electrical detection signal upon contact with the wire 20. The internal upstream and downstream sensors 72, 74 are in electrical communication with the controller of the first wire handler 12.

An upstream fluid orifice 76 is provided in the first sidewall 52 which opens into the wire support chamber 32 and extends completely through the thickness of the first sidewall 52. The upstream fluid orifice 76 typically has a constant uniform diameter in a range of about 0.062 to 0.125 inches. The upstream fluid orifice 76 is positioned at or near the base 50, below the wire conveyance path 18, and proximal to the back 46, upstream of the internal central sensor 70 and internal upstream sensor 72. The central axis of the upstream fluid orifice 76 is aligned substantially perpendicular to the first and second sidewalls 52, 54. The upstream fluid orifice 76 is connected to the fluid line 26 to provide fluid communication between the pressurized fluid source 24 and the wire support chamber 32. A flow regulator (not shown), such as an adjustable valve, may be provided in the fluid line 26 at the upstream fluid orifice 76 to set the flow rate of pressurized fluid entering the wire support chamber 32 through the upstream fluid orifice 76 at a predetermined constant flow rate. The pressurized fluid is preferably a contaminant-free, relatively inert gas, such as air or nitrogen, which is maintained in the pressurized fluid source 24 at a pressure significantly greater than the ambient external pressure. A typical pressurized fluid has a pressure in a range of about 30 to 80 psi.

A downstream fluid orifice 78 having substantially the same dimensions as the upstream fluid orifice 76 is provided in the first sidewall 52 which also opens into the wire support chamber 32 and extends completely through the thickness of the first sidewall 52. The downstream fluid orifice 78 is positioned at or near the base 50 proximal to the front 48, downstream of the internal central sensor 70 and internal downstream sensor 72. The central axis of the downstream fluid orifice 78 is aligned substantially perpendicular to the first and second sidewalls 52, 54. The downstream fluid orifice 78 is connected to the fluid line 26, also providing fluid communication between the pressurized fluid source 24 and the wire support chamber 32. A separate flow regulator (not shown), such as an adjustable valve, may be provided in the fluid line 26 at the downstream fluid orifice 78 to set the flow rate of the pressurized fluid entering the wire support chamber 32 through the downstream fluid orifice 78 to a predetermined constant rate.

Although the upstream and downstream fluid orifices 76, 78 have been shown in FIGS. 3 and 4 and described herein as being provided in the first sidewall 52, it is apparent to the skilled artisan that either the upstream fluid orifice 76 or the downstream fluid orifice 78 or both can alternatively be provided in the second sidewall 54 within the scope of the present invention. Similarly, it is within the scope of the present invention to alternatively mount the internal central sensor 70 in the second sidewall 54. FIG. 5 shows the downstream fluid orifice 78 and internal central sensor 70 alternatively positioned in the second sidewall 54 while the upstream fluid orifice 76 remains positioned in the first sidewall 52. It is further noted that the present invention is not limited to the specific dual orifice configuration of the wire slacking device 14 disclosed herein. Other fluid orifice configurations are possible within the scope of the present invention subject to the performance requirements recited herein.

The base 50 is contoured to direct the pressurized fluid exiting the upstream and downstream fluid orifices 76, 78 into the upstream and downstream fluid paths 80, 82, respectively, within the wire support chamber 32. Specifically, the surface of the base 50 is substantially even with the bottom of the upstream fluid orifice 76. The base 50 has an upward incline 84 from the upstream fluid orifice 76 to the back edge 64 on the upstream side of the orifice 76. The base 50 proceeds at a right angle from the upstream fluid orifice 76 on the downstream side of the orifice 76 to form a shelf 86 where the internal upstream sensor 72 is positioned substantially out of the upstream fluid path 80. Accordingly, the upstream fluid path 80 is relatively vertical, being defined as entering through the upstream fluid orifice 76, extending upward through the wire support chamber 32 between the first and second sidewalls 52, 54, and out the back opening 62 and open top 38 of the wire support chamber 32. The path 80 is effectively bound on the back and front by the incline 84 and shelf 86, respectively.

The base 50 is similarly contoured with respect to the downstream fluid orifice 78. The surface of the base 50 is substantially even with the bottom of the downstream fluid orifice 78 and has an upward incline 88 from the orifice 78 to the front edge 68 on the downstream side of the orifice 78. The base 50 proceeds at a right angle from the downstream fluid orifice 78 on the upstream side of the orifice 78 to form a shelf 90 where the internal downstream sensor 74 is positioned substantially out of the downstream fluid path 82. Accordingly, the downstream fluid path 82 is relatively vertical, being defined as entering through the downstream fluid orifice 78, extending upward through the wire support chamber 32 between the first and second sidewalls 52, 54, and out the front opening 66 and open top 38 of the wire support chamber 32. The path 82 is effectively bound on the front and back by the incline 88 and shelf 90, respectively.

It is noted that the upstream and downstream fluid paths 80, 82 are the enabling means for the wire support path 92, as will be described below in the method of operation. The wire support path 92 is the segment of the wire conveyance path 18 internal to the wire support chamber 32 which is essentially contactless with respect to the wire slacking device 14, i.e., the wire support path 92 does not intersect any structural components of the wire slacking device 14. Thus, the wire 20 being conveyed along the wire support path 92 preferably does not come into contact with any structural components of the wire slacking device 14 during normal operation. The wire support path 92 is substantially horizontal, being relatively orthogonal to the upstream and downstream fluid paths 80, 82 and extending into the wire support chamber 32 through the back opening 62 and out of the wire support chamber 32 through the front opening 66. The wire support path 92 is maintained substantially above the external upstream sensor 28, internal central sensor 70, internal upstream sensor 72 and internal downstream sensor 74 and the upstream and downstream fluid orifices 76, 78, while being maintained substantially below the open top 38 and external downstream sensor 30.

METHOD OF OPERATION

The method of operating the wire conveyance system 10 including the wire slacking device 14 is described below with reference to the figures. Operation is initiated by loading the first wire handler 12, wire slacking device 14 and second wire handler 16 with the bonding wire 20. Loading of the first and second wire handlers 12, 16 is performed in accordance with standard methods known in the art. The wire slacking device 14 is loaded by manually feeding the wire 20 into the wire support chamber 32. Specifically, the operator draws the wire 20 over the open top 38 and allows the wire 20 to fall under the force of gravity into the wire support chamber 32 using the beveled borders 56, 58 60 as a wire guide. Flow of pressurized fluid from the pressurized fluid source 24 into the wire support chamber 32 is then initiated. Substantially laminar flow is achieved in both the upstream and downstream fluid paths 80, 82 because the pressurized fluid is confined by the relatively small width dimension of the wire support chamber 32. Laminar flow within the wire support chamber 32 is indicated by the parallel directional flow arrows of FIGS. 3 and 4. FIGS. 3 and 4 further show that laminar flow transitions to turbulent flow in the region above the wire support chamber 32 when the pressurized fluid exits the wire support chamber 32 as indicated by the circuitous directional arrows.

The flow of pressurized fluid through the upstream and downstream fluid paths 80, 82 exerts an upward force against the wire 20, which drives the wire upward into the wire support path 92. The fluid flow rate is set by means of the flow regulators to balance the upward fluid force against the wire 20 with the downward gravitational force against the wire 20, thereby maintaining the wire 20 at equilibrium in the wire support path 92. The flow regulators may be controlled manually by the operator or alternatively an automated control system may be employed.

The sensors 28, 30, 70, 72, 74 are provided to ensure the performance of the first and second wire handlers 12,16 and the wire slacking device 14. In general, the sensors function by monitoring the position of the wire 20 and automatically transmitting electrical position notification signals to the controller of a given device. The controller automatically communicates an appropriate instruction to the device in response to the position notification signal. In accordance with one embodiment of the invention, the sensors ensure that the output requirements of the first wire handler 12 or the demand requirements of the second wire handler 16 are satisfied by controlling the rate at which the wire 20 is fed into the wire slacking device 14 from the first wire handler 12. If the wire 20 drops down from the wire support path 92 to a predetermined minimum threshold distance from the internal central sensor 70 due to an insufficient wire feed rate from the first wire handler 12, the sensor 70 outputs an electrical position notification signal to the controller of the first wire handler 12, which instructs the first wire handler 12 to increase the wire feed rate to the wire slacking device 14. If the first and second wire handlers 12,16 are operating in opposition to one another, the wire 20 is drawn taut in contact across the internal upstream sensor 72 or the internal downstream sensor 74 and an electrical position notification signal is transmitted to the controller of the first wire handler 12 upon contact with the wire 20. The controller in turn provides an appropriate instruction to the first wire handler 12.

In accordance with another embodiment of the invention, the sensors ensure that the first and second wire handlers 12,16 and the wire slacking device 14 properly maintain the wire 20 in the wire conveyance path 18. If the pressurized fluid force is insufficient to maintain the wire 20 elevated in the wire support path 92, the wire 20 drops from the wire support path and contacts the internal upstream sensor 72 or the internal downstream sensor 74. The sensor 72 or 74 automatically transmits an electrical position notification signal to the controller of the first wire handler 12 which instructs the first wire handler 12 to interrupt or decrease the wire feed rate to the wire slacking device 14. If the second wire handler 16 releases the wire 20 or the first wire handler feeds an excess of the wire 20 to the first wire handler 12, the wire 20 is driven upward out of the wire support path 92 and wire support chamber 32 into turbulent flow and contact with the external downstream sensor 30. The sensor 30 transmits an electrical position notification signal to the controller of the bond head (not shown) to interrupt operation in response to contact with the wire 20.

It is apparent that the skilled artisan can employ the wire slacking device 14 to control the degree of slack in the wire 20 by controlling the wire feed rate from the first wire handler 12 in the above-described manner. It is generally desirable to maintain a substantially constant slack length, termed a service loop 94, in the bonding wire 20 downstream of the wire slacking device 14 to minimize damage to the bonding wire 20 in the wire conveyance system 10. The service loop 94 preferably has a sufficient length to satisfy the requirements of the second wire handler 16. The length of the service loop 94 also determines the degree of counter force that the bonding wire 20 exerts on the second wire handler 16 in opposition to the force exerted on the bonding wire 20 by the second wire handler 16. If the service loop 94 is maintained at a relatively long length, the counter force advantageously approaches a constant value which is relatively insensitive to small variations in length caused by fluctuations in the output demand of the first wire handler 12 or the input demand of the second wire handler 16.

The internal central sensor 70 specifically enables cooperative operation of the first and second wire handlers 12, 16 to maintain the desired length of the service loop 94. For example, if the second wire handler 16 is drawing the wire 20 from the wire slacking device 14 at a greater rate than the first wire handler 12 is feeding the wire 20 to the wire slacking device 14, the length of the wire 20 in the service loop 94 shortens. Consequently, the wire 20 drops below the predetermined minimum threshold distance of the internal central sensor 70. The sensor 70 transmits an electrical position notification signal to the controller of the first wire handler 12 in response to the depressed position of the wire 20 and the first wire handler 12 is instructed to increase the wire feed rate to the wire slacking device 14. If the wire support chamber 32 is too small to accommodate the increased wire supply, the level of the wire 20 drops upstream of the housing 22 and contacts the external upstream sensor 28. The sensor 28 transmits an electrical position notification signal to the controller of the first wire handler 12 upon contact with the wire 20 and the first wire handler 12 is instructed to interrupt or decrease the wire feed rate to the wire slacking device 14.

While the forgoing preferred embodiments of the invention have been described and shown, it is understood that alternatives and modifications, such as those suggested and others, may be made thereto and fall within the scope of the invention.

We claim:

1. A wire slacking device comprising:
    a wire support chamber having a substantially enclosed bottom and opposing first and second vertical sidewalls and further having a substantially open top, a back opening and a front opening;
    a fluid orifice extending through said first sidewall for receiving a pressurized fluid;
    a fluid path in fluid communication with said fluid orifice, wherein said fluid path extends continuously through said wire support chamber, passing into said fluid orifice, upward between said first and second sidewalls, and out said open top, wherein said wire support chamber is substantially continuously open from said fluid orifice to said open top such that said fluid path extends continuously upward between said first and second sidewalls substantially free from flow restrictions positioned overhead said fluid orifice between said first and second sidewalls; and
    a wire support path in fluid communication with said fluid orifice, wherein said wire support path extends continuously through said wire support chamber above said fluid orifice, passing into said back opening, laterally between said first and second sidewalls, and out said front opening.

2. The wire slacking device of claim 1 wherein said fluid orifice is a first fluid orifice, said wire slacking device further comprising a second fluid orifice extending through said first or second sidewall for receiving a pressurized fluid, further wherein said second fluid orifice is positioned downstream of said first fluid orifice.

3. The wire slacking device of claim 1 wherein said wire support path is substantially contactless with respect to said wire slacking device.

4. The wire slacking device of claim 1 wherein said fluid orifice has a central axis aligned substantially perpendicular to said second sidewall.

5. The wire slacking device of claim 1 further comprising an internal wire sensor positioned in said wire support chamber below said wire support path.

6. The wire slacking device of claim 2 further comprising an internal wire sensor positioned in said wire support chamber below said wire support path.

7. The wire slacking device of claim 6 wherein said internal wire sensor is positioned between said first and second fluid orifices.

8. The wire slacking device of claim 1 further comprising a wire sensor positioned above said wire support path.

9. The wire slacking device of claim 5 wherein said internal wire sensor is a first internal wire sensor, said wire slacking device further comprising a second internal wire sensor positioned in said wire support chamber below said wire support path.

10. The wire slacking device of claim 9 wherein said first internal wire sensor, is a proximity sensor and said second internal wire sensor is a contact sensor.

11. The wire slacking device of claim 1 further comprising a pressurized fluid source in fluid communication with said fluid orifice.

12. A method of maintaining a slack length in a wire comprising:
    providing a wire support chamber having a substantially enclosed bottom and opposing first and second vertical sidewalls and further having a substantially open top, a back opening and a front opening;
    conveying a wire along a wire support path extending continuously through said wire support chamber, passing into said back opening, laterally between said first and second sidewalls, and out said front opening;
    injecting a pressurized fluid into said wire support chamber at a fluid injection rate via a fluid orifice extending through said first sidewall below said wire support path and directing said pressurized fluid through a fluid path past said wire, wherein said fluid path extends continuously through said wire support chamber, passing upward between said first and second sidewalls and out said open top and wherein said wire support chamber is substantially continuously open from said fluid orifice to said open top such that said fluid path extends continuously upward between said first and second sidewalls substantially free from flow restrictions positioned overhead said fluid orifice between said first and second sidewalls; and
    maintaining said wire suspended in said wire support path in response to said pressurized fluid.

13. The method of claim 12 wherein said fluid orifice is a first fluid orifice and said fluid path is a first fluid path, said method further comprising injecting said pressurized fluid into said wire support chamber via a second fluid orifice extending through said first or second sidewall below said wire support path downstream of said first fluid orifice and directing said pressurized fluid through a second fluid path past said wire, wherein said second fluid path extends continuously through said wire support chamber, passing upward between said first and second sidewalls and out said open top downstream of said first fluid path.

14. The method of claim 12 wherein said pressurized fluid is injected into said wire support chamber at a substantially perpendicular angle to said second sidewall.

15. The method of claim 12 further comprising monitoring fluctuations in the position of said wire in said wire support path and varying said fluid injection rate in response to said fluctuations.

16. The method of claim 12 wherein said wire is maintained in substantially contactless relation with the sides of said wire support chamber.

17. A method of maintaining a slack length in a wire comprising:

provoding a wire support chamber having a substantially enclosed bottom and opposing first and second vertical sidewalls and further having a substantially open top, a back opening and a front opening;

feeding a wire from a first wire handler to said wire support chamber at a wire feed rate;

conveying said wire along a wire support path extending continuously through said wire support chamber, passing into said back opening, laterally between said first and second sidewalls, and out said front opening;

injecting a pressurized fluid into said wire support chamber at a fluid injection rate via a fluid orifice extending through said first sidewall below said wire support path and directing said pressurized fluid through a fluid path past said wire, wherein said fluid path extends continuously through said wire support chamber, passing upward between said first and second sidewalls and out said open top and wherein said wire support chamber is substantially continuously open from said fluid orifice to said open top such that said fluid path extends continuously upward between said first and second sidewalls substantially free from flow restrictions positioned overhead said fluid orifice between said first and second sidewalls;

withdrawing said wire from said wire support chamber to a second wire handler at a wire withdrawal rate;

maintaining said wire suspended in said wire support path in response to said pressurized fluid; and forming a slack length in said wire withdrawn from said wire support chamber.

18. The method of claim 17 further comprising monitoring fluctuations in the position of said wire in said wire support path and varying said wire feed rate in response to said fluctuations.

19. The method of claim 17 further comprising monitoring fluctuations in the position of said wire in said wire support path and varying said fluid injection rate in response to said fluctuations.

20. The method of claim 17 wherein said fluid orifice is a first fluid orifice and said fluid path is a first fluid path, said method further comprising injecting said pressurized fluid into said wire support chamber via a second fluid orifice extending through said first or second sidewall below said wire support path downstream of said first fluid orifice and directing said pressurized fluid through a second fluid path past said wire, wherein said second fluid path extends continuously through said wire support chamber, passing upward between said first and second sidewalls and out said open top downstream of said first fluid path.

21. The method of claim 12 wherein said wire support chamber is configured such that said pressurized fluid exhibits substantially continuous laminar flow between said first and second sidewalls.

22. The method of claim 17 wherein said wire support chamber is configured such that said pressurized fluid exhibits substantially continuous laminarflow between said first and second sidewalls.

* * * * *